United States Patent
Taguwa

(10) Patent No.: US 7,563,698 B2
(45) Date of Patent: Jul. 21, 2009

(54) METHOD FOR MANUFACTURING SEMICONDUCTOR DEVICE

(75) Inventor: Tetsuya Taguwa, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 6 days.

(21) Appl. No.: 12/071,971

(22) Filed: Feb. 28, 2008

(65) Prior Publication Data

US 2008/0213983 A1    Sep. 4, 2008

(30) Foreign Application Priority Data

Mar. 2, 2007    (JP) .................. 2007-052783

(51) Int. Cl.
*H01L 21/20* (2006.01)
(52) U.S. Cl. ............... 438/486; 438/337; 438/502; 257/E21.428; 257/E29.028; 257/E29.257
(58) Field of Classification Search ........... 438/243, 438/257, 275, 430, 486; 257/329, 330, 331, 257/332, 337, E21.428, E29.201, 27, 66, 257/28, 29, 257, 261
See application file for complete search history.

(56) References Cited

U.S. PATENT DOCUMENTS 6,211,549 B1* 4/2001 Funaki et al. ............. 257/329
2004/0150020 A1* 8/2004 Yamada et al. ............. 257/296
2005/0191831 A1* 9/2005 Tagawa ..................... 438/519

FOREIGN PATENT DOCUMENTS

| JP | 2003-163348 | 6/2003 |
| JP | 2005-39270 | 2/2005 |

* cited by examiner

*Primary Examiner*—Charles D. Garber
*Assistant Examiner*—Yasser A Abdelaziez
(74) *Attorney, Agent, or Firm*—Young & Thompson

(57) ABSTRACT

Method for manufacturing a semiconductor device including a transistor having a grooved gate structure and a transistor having a planar gate structure on the same substrate, in which, even when the semiconductor device is configured as a dual gate structure in which a gate electrode structure is a polymetal gate structure, and a grooved gate and a planar gate are made in different conductivity types, then sufficient dopant is injected into polysilicon in the grooved gate to prevent depletion, and impurity ions do not pass through a gate insulating film even when the planar gate is formed also polysilicon having the same film thickness. The method includes: injecting ions into an amorphous silicon layer for the grooved gate; subsequently, turning it into polysilicon once; injecting ions once again to amorphousize a surface layer of the polysilicon layer and injecting ions of a different conductivity type for the planar gate.

11 Claims, 4 Drawing Sheets

METHOD FOR MANUFACTURING SEMICONDUCTOR DEVICE

This application is based upon and claims the benefit of priority from Japanese patent application No. 2007-052783, filed on Mar. 2, 2007, the disclosure of which is incorporated herein in its entirety by reference.

BACKGROUND OF THE INVENTION

1. Field of the Invention

The present invention relates to a method for manufacturing a semiconductor device, and particularly to a method for manufacturing a semiconductor device having a dual gate structure in which a transistor having a grooved gate structure and a transistor having a planar gate structure are provided on the same substrate, and a grooved gate and a planar gate are made in different conductivity types.

2. Related Art

Recently, semiconductor devices, especially dynamic random access memories (DRAMs), have often used a poly-metal gate structure to improve operating speeds of the devices. The poly-metal gate structure means a stacked structure of a polysilicon layer and a metal layer, in which it is easy to control impurity concentration in the polysilicon layer and which can operate at a high speed because of a combination with a low-resistance metal such as tungsten. A method for manufacturing a gate electrode employing the poly-metal gate structure is disclosed, for example, in JP-A No. 2003-163348 (D1). The method described in D1 includes: stacking an impurity-doped polysilicon layer, a silicide layer of a first refractory metal, a nitride layer of the first refractory metal and a second refractory metal layer in sequence; and heat treating the stacked layers in an integrated manner. This method, while efficiently preventing occurrence, upon heat treating, of failures such as lowered impurity concentration in the impurity-doped polysilicon layer, or diffusion of metal atoms from the refractory metal layers, provides the gate electrode having a structure in which the silicide-nitride layer of the refractory metal, which is a diffusion barrier layer, can be formed as thin as possible, so that interface resistance between the refractory metal layer and the impurity-doped polysilicon layer can be more reduced, compared to a conventional one.

Further, to improve performance and lower drive voltage of devices, a poly-metal gate structure of a dual gate type has been also employed. The dual gate structure is a structure using: a gate electrode including N-type polysilicon into which an N-type impurity (such as phosphorus (P)) is injected, for a gate electrode of an N-channel transistor; and a gate electrode including P-type polysilicon into which a P-type impurity (such as boron (B)) is injected, for a gate electrode of a P-channel transistor.

On the one hand, as devices are further miniaturized, a distance between a source and a drain is narrowed, and there arises a problem of a so-called "short channel effect" such as an increase in junction leakage current, lowering of breakdown voltage between a source and a drain, and a decrease in data holding time. For one method to solve the short channel effect, a so-called "grooved gate structure" is formed in which a groove is formed in a substrate, and in the groove, a gate electrode is formed, thereby an effective channel length can be efficiently prolonged. JP-A No. 2005-39270 (D2) discloses a device in which, especially in a memory cell portion that has been further miniaturized, the grooved gate structure is employed, and in a portion that has not been severely required to be miniaturized, such as a logic portion, a conventional, planar gate structure is employed.

There is provided a combination of the related arts described above, that is, the poly-metal gate structure configured by stacking the polysilicon layer, the ion injection layer, the silicide layer, the metal nitride layer, and the metal layer as disclosed in D1, and the dual gate structure in which the grooved gate and the planar gate are provided on one substrate, and the grooved gate and the planar gate are made in different conductivity types as disclosed in D2, are combined with each other, and thereby, it is thought, a superior device would be provided that solves defects accompanying miniaturization of devices. Then, the present inventors studied production of such devices. However, if, for reduction in processes, a polysilicon layer under a gate layer is formed in one process, dopant does not sufficiently spread in the polysilicon layer to be buried into the groove, on the grooved gate side, and it is difficult to maintain transistor characteristics because of depletion of the polysilicon in the case where the polysilicon layer providing the gate electrode is formed to have a film thickness most suitable for the planar gate. The depletion of the polysilicon in the grooved gate may be solved to some degree by increasing a dose amount, but a too much dose amount makes resistance in a gate interface high, and it is difficult to appropriately control the dose amount.

On the other hand, if the polysilicon layer is formed to have a film thickness in which the dopant sufficiently spreads in the polysilicon in the groove, an impurity different from that of the grooved gate, for example, boron, is injected to the planar gate, then there occurs a phenomenon in which boron passes through a gate insulating film, so that characteristics of a planar gate transistor can not be maintained because of variation in a threshold voltage of the transistor.

As a matter of course, the grooved gate and the planar gate are separately formed, and a polysilicon layer having a film thickness most suitable for each is formed, respectively, which solves such problems, but by just that much, processes increase, and are made cumbersome and complicated. When the grooved gate and the planar gate are made in an identical conductivity type as in D2 described above, polysilicon can be formed while dopant is injected, so that these problems do not occur.

SUMMARY OF THE INVENTION

Therefore, an object of the present invention is to provide a new method for manufacturing a semiconductor device including a transistor having a grooved gate structure and a transistor having a planar gate structure on the same substrate, in which, even when the semiconductor device is configured as a dual gate structure in which a gate electrode structure is a poly-metal gate structure, and a grooved gate and a planar gate are made in different conductivity types, then sufficient dopant is injected into polysilicon in the grooved gate to prevent depletion, and on the one hand, impurity ions do not pass through a gate insulating film even when the planar gate is formed also of polysilicon having the same film thickness.

The present inventor has hard studied to solve the problems described above, and as the result, made the present invention described below.

That is, the present invention provides a method for manufacturing a semiconductor device including both of a grooved gate transistor and a planar gate transistor on a same semiconductor substrate, the method comprises:

(a) forming a groove in the semiconductor substrate in the forming region of the grooved gate transistor, (b) filling the groove provided in the semiconductor substrate in the forming region of the grooved gate transistor to form an amorphous silicon layer on the entire surface, (c) ion injecting an impurity of a first conductivity type into the amorphous silicon layer in the forming region of the grooved gate transistor, (d) entirely heating the semiconductor substrate to convert the amorphous silicon layer to a polysilicon layer, (e) amorphousizing a surface layer of the polysilicon layer, and (f) ion injecting an impurity of a second conductivity type into the amorphousized surface layer and the polysilicon layer in the forming region of the planar gate transistor.

According to the present invention, the gate polysilicon layer can be formed in a film thickness suitable for manufacturing the grooved gate transistor, and accordingly dopant can sufficiently spread into the polysilicon in the groove by a most suitable dose amount, thereby deterioration of the transistor due to depletion can be prevented. On the other hand, in the planar gate transistor of the conductivity type different from that of the grooved gate transistor, even if the polysilicon layer has a film thickness in which ions usually pass through the gate insulating film, target ions can be prevented from passing through the gate insulating film because the surface of the polysilicon layer is amorphousized by using ions of the conductivity type different from that of the target ions.

Further, dopant diffusion into a silicide layer of a first refractory metal formed on the amorphousized surface layer of the polysilicon to form a poly-metal gate described below can be suppressed, and mutual diffusion can be also controlled, which allows resistance in the gate interface to be made small and operation of the device to be kept at a high speed.

DETAILED DESCRIPTION OF THE PREFERRED EMBODIMENTS

Now, exemplary embodiments of the present invention will be hereinafter described with reference to the accompanying drawings.

Figure 1:
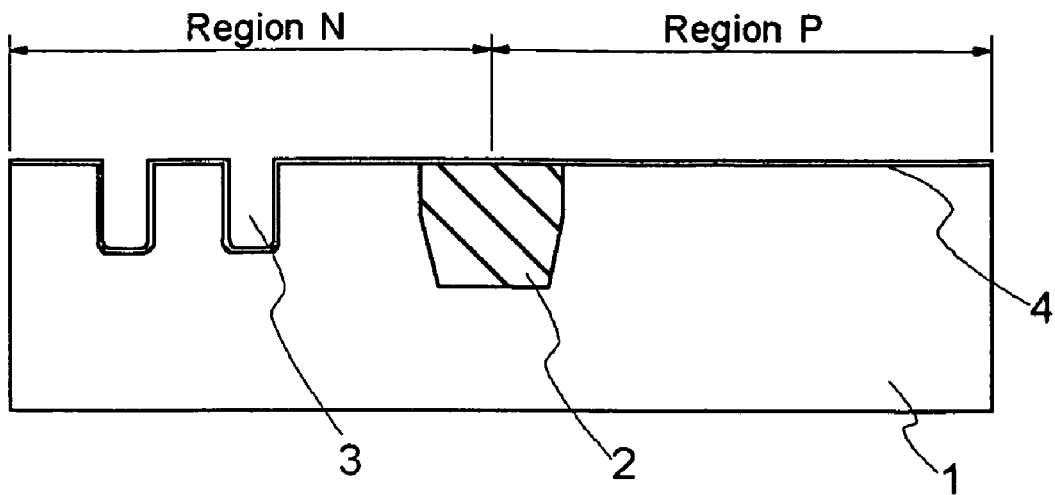
FIGS. 1 to 10 are cross-section views of process illustrating a method for manufacturing a semiconductor device having a grooved gate structure and a planar gate structure according to one exemplary embodiment of the present invention.

FIGS. 1 to 10 are views of process schematically illustrating production process of an N-channel transistor and a P-channel transistor including a gate electrode having a grooved gate structure and a planer gate structure according to the exemplary embodiments of the present invention. In FIG. 1, "Region N" on the left side of the figure shows a region for forming the N-channel transistor including an N-type grooved gate electrode in a memory cell portion, and "Region P" on the right side of the figure shows a region for forming the P-channel transistor including a P-type poly-metal gate electrode, and the following figures are also similar.

First, as shown in FIG. 1, in a predetermined region of semiconductor substrate 1, element isolation insulating film 2 is formed by a shallow trench isolation (STI) technique. Accordingly, Region N and Region P are separated from each other. Next, in the memory cell portion of Region N, grooved gate hole 3 is formed. A method for forming grooved gate hole (groove) 3 is described, for example, in D1 described above. Then, Region N is doped with boron (B) as a P-type impurity to form a P-well (not shown), and Region P is doped with phosphorus (P) as an N-type impurity to form an N-well (not shown). Further, the surface of semiconductor substrate 1 is thermally oxidized to form gate oxide film 4 having a thickness of about 4 nm.

Figure 2:
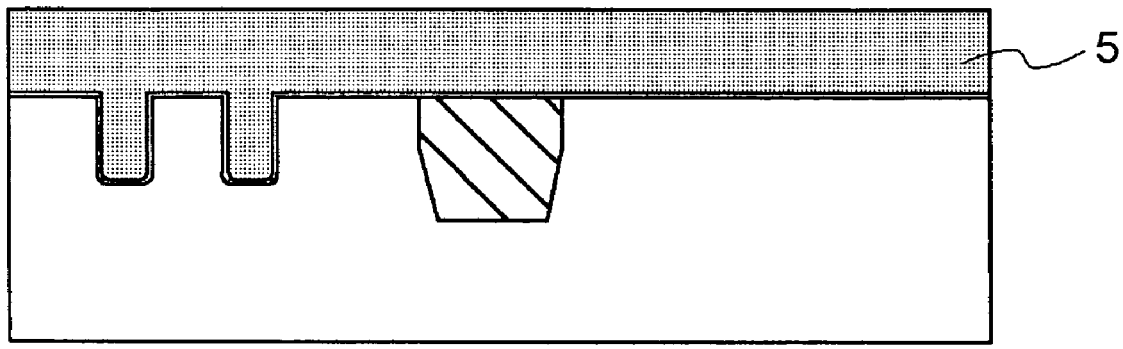

Next, as shown in FIG. 2, on gate oxide film 4, non-doped amorphous silicon layer 5 is formed to have a thickness of about 70 nm by a chemical vapor deposition (CVD) method.

Figure 3:
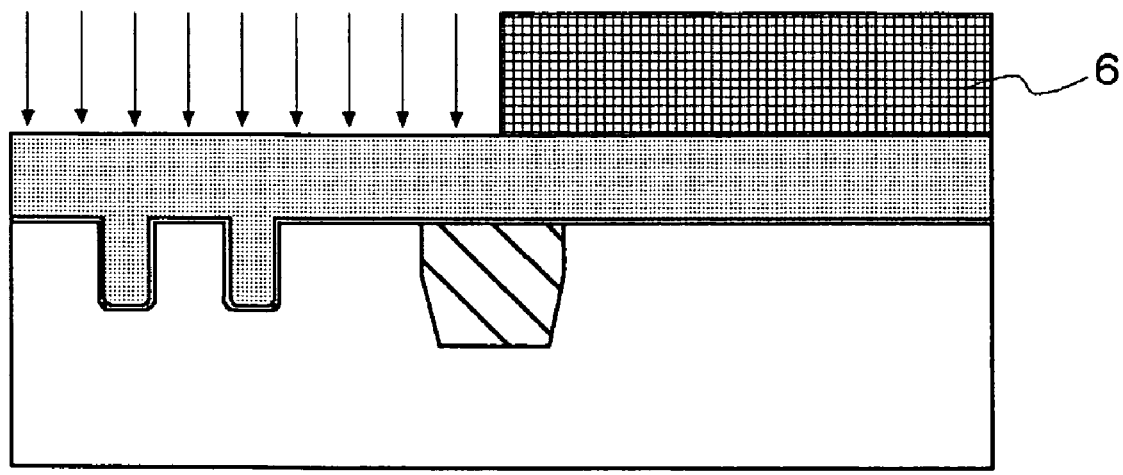

Next, as shown in FIG. 3, Region P is covered with resist mask 6, and phosphorus (P) as an N-type impurity is ion injected into non-doped amorphous silicon layer 5 in Region N at acceleration energy of 15 keV and a dose amount of about 5E15 at/$cm^2$, turning non-doped amorphous silicon layer 5 in Region N into N-type.

Here, phosphorus can be more diffused in a groove, as injection energy of phosphorus is as high as possible and concentration of phosphorous in a direction of the substrate is higher. The injection energy changes dependent on the film thickness of non-doped amorphous silicon layer 5 formed previously, and in the case of 70 nm, it is preferably from 10 to 35 keV. Further, it is empirically understood that, when the dose amount of phosphorus is small, there is deterioration of transistor characteristics due to depletion of a film to form a polysilicon layer in a post-process, and at a too much dose amount of phosphorus, there is an increase in resistance in a gate interface in a post-process, and so the dose amount of phosphorus is preferably from 3.5E15 at/$cm^2$ to 8.0E15 at/$cm^2$.

Figure 4:
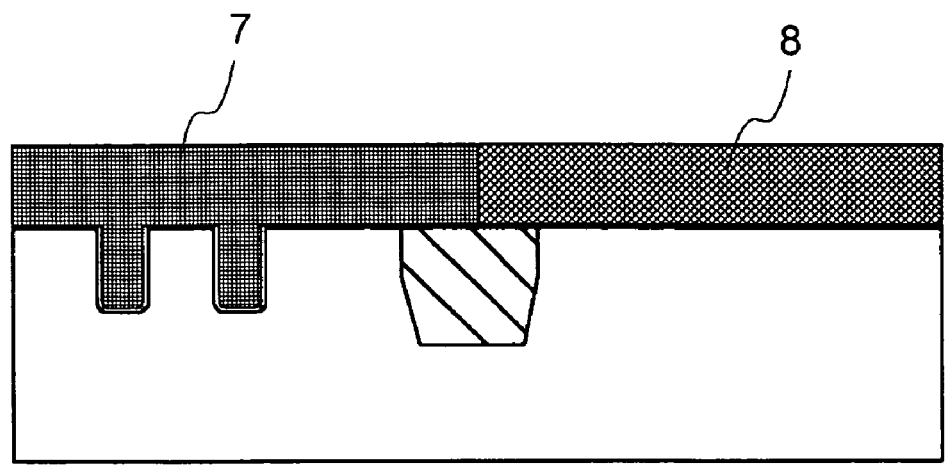

Next, heat treatment, for example, rapid thermal annealing (RTA), is performed for 10 seconds in an atmosphere of a mixed gas of oxygen and nitrogen or in an oxygen gas atmosphere, at a temperature of 1000° C. The treatment, as shown in FIG. 4, turns Region N into phosphorus-doped polysilicon layer 7, and Region P into non-doped polysilicon layer 8. The heat treatment is intended to sufficiently deeply diffuse phosphorus, an N-type impurity, into the groove formed in Region N, and the heat treatment is desirably performed at a temperature as high as possible which is equal to or higher than 800° C. However, at a too high temperature of heat treatment, there may be lowering of the concentration of phosphorus due to out-diffusion of phosphorus, or diffusion of phosphorus to a reserved portion for forming a transistor in Region P dependent on circuit design, and any one of them may deteriorate transistor characteristics, so that the temperature is preferably equal to or lower than 1100° C.

Figure 5:
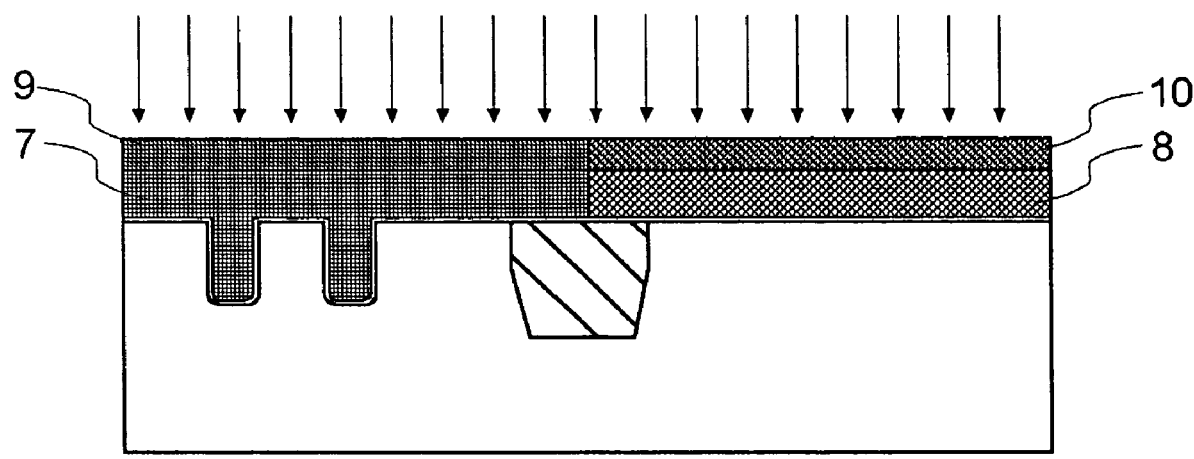

Next, as shown in FIG. 5, polysilicon layers 7 and 8 near the outer surface are turned into amorphous silicon layers 9 and 10 by, for example, an ion injection method so that the entire surface of a wafer, or at least both of Region N and Region P are included. To amorphousize the surface layer of the polysilicon layers 7 and 8, phosphorus is injected, for example, at acceleration energy of 5 keV and a dose amount of 5E14 at/$cm^2$. Amorphous silicon layers 9 and 10 are formed to have a thickness of about 5 nm to about 30 nm, which provides a sufficient effect.

Here, regarding Region N, it was confirmed that resistance of the gate interface which had been 2 to 4 k$\Omega$/$\mu m^2$ was lowered to about 0.5 k$\Omega$/$\mu m^2$ by processing described above.

Figure 6:
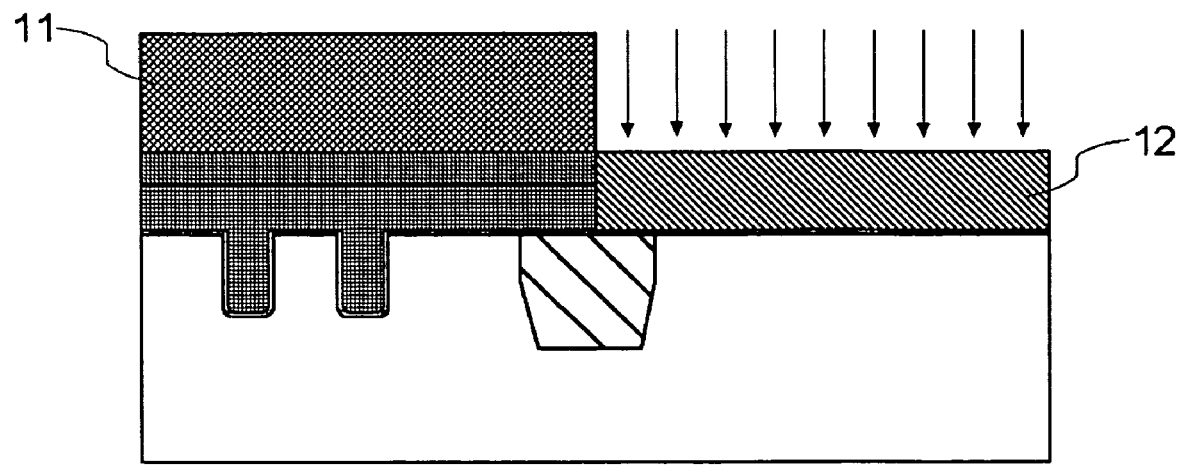

Next, as shown in FIG. 6, resist mask 11 for covering Region N is formed, and into the silicon layer (amorphous silicon layer 10 and polysilicon layer 8) in Region P, boron (B) as a P-type impurity is ion injected at acceleration energy of about 3 keV and a dose amount of about 1E15 at/$cm^2$ to about 5E16 at/$cm^2$, and preferably a dose amount of about 3E15 at/$cm^2$ to about 1E16 at/$cm^2$, and thereby the silicon layer in Region P is turned into P-type silicon layer 12.

Here, amorphous silicon layer 10 exists, and thereby there can be suppressed occurrence of a generally known phenomenon in that boron passes through the gate oxide film because of the channeling effect in which a grain boundary in polysilicon becomes a path during ion injection.

It was confirmed that the phenomenon in which boron passed through the gate oxide film could be lowered equal to or smaller than about one-half when processing was carried out in a manner of the present embodiment. Further, regarding Region P, resistance of a finished gate interface was about 0.1 $\Omega/\mu m^2$, and it was found that there was not any problem when, under the conditions described above, phosphorus was used once again for amorphousization.

Here, to prevent boron from passing through the gate oxide film in Region P, it is generally required to lower injection energy of boron. In this case, because tungsten silicide to be formed in a post-process has a diffusion coefficient larger than that in silicon, boron is absorbed, which contributes polysilicon depletion and diffusion of boron to Region N, and thereby transistor characteristics may be considerably deteriorated. However, it is empirically understood that, using phosphorus once again for amorphousization as described above, boron and phosphorus interfere with each other, and accordingly a diffusion speed of boron can be lowered, and from the result of this, boron can be also prevented from being absorbed by the tungsten silicide layer to be formed in a post-process.

Figure 7:
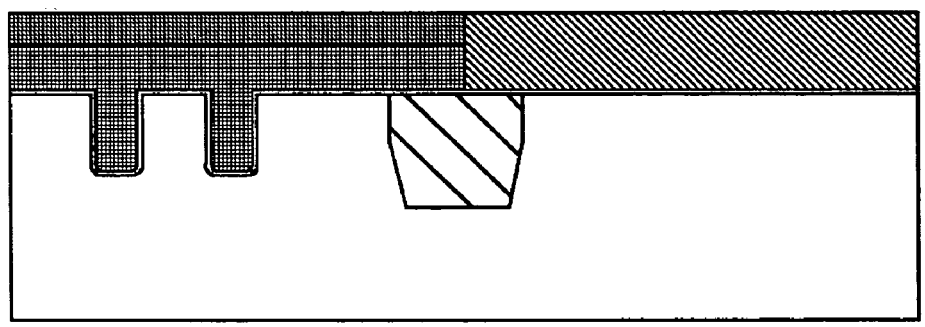

Next, as shown in FIG. 7, the resist mask is removed.

Figure 8:
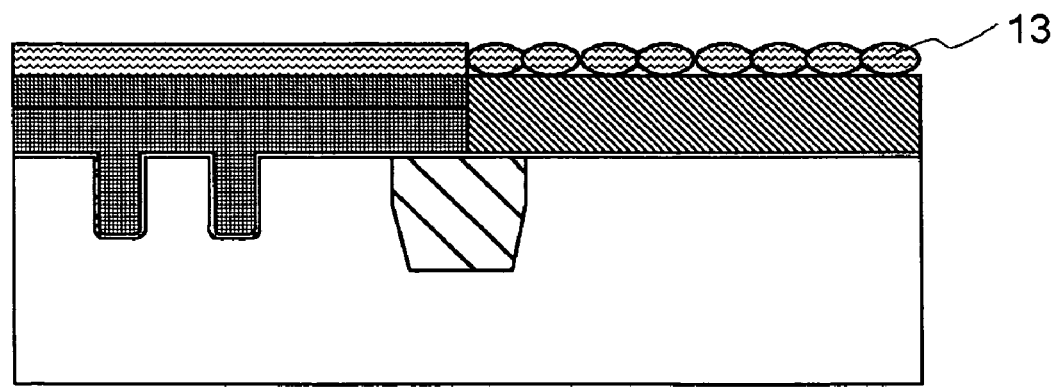

Then, a natural oxide film formed on the surface of the silicon layers (the N-type silicon layer and the P-type silicon layer) is removed by using a mixture solution of fluorinated acid (HF) and aqueous hydrogen peroxide ($H_2O_2$), and subsequently, as shown in FIG. 8, tungsten silicide ($WSi_2$) layer 13 is formed as a silicide layer of a first refractory metal on the silicon layers. Here, the tungsten silicide is to be grown on the amorphous silicon in both of Region N and Region P.

Tungsten silicide layer 13 is formed by reaction for about 30 seconds at a pressure in a reaction chamber of about 30 Pa to about 100 Pa, and a temperature of the semiconductor substrate of about 550° C. by the CVD method, with dichlorosilane ($SiH_2Cl_2$) having a flow rate of about 200 sccm and tungsten hexafluoride ($WF_6$) having a flow rate of about 2 sccm being supplied, respectively. At this time, tungsten silicide layer 13 is preferably formed to have a deposited film thickness of about 3 nm to about 10 nm, and preferably about 5 nm to about 7 nm. Here, there has been described the example using the CVD method that can relatively easily perform thin film control.

Next, supplying $WF_6$ to the reaction chamber as a gas to form tungsten silicide layer 13 is stopped, the flow rate of dichlorosilane is raised to about 300 sccm, argon (Ar) is supplied by a flow rate of about 800 sccm, the temperature of the semiconductor substrate is set to about 500° C., and the pressure in the reaction chamber is set to about 50 Pa to about 300 Pa, and then a continuous thin film silicon (not shown) is formed for about 5 seconds to about 120 seconds, and preferably 40 seconds to 120 seconds on the outer surface of tungsten silicide layer 13. A too thin film thickness of the thin film silicon may not provide a sufficient effect that suppresses an increase in resistance due to discontinuity given to tungsten silicide layer 13 in the P-type poly-metal gate electrode, and a too thick film thickness may cause electrical conductivity between tungsten nitride (WN) layer as a nitride layer of the first refractory metal and a tungsten (W) layer as a second refractory metal layer to be formed on the continuous thin film silicon, and the tungsten silicide layer and the silicon layer to decrease, and resistance of both the N-type and P-type poly-metal gate electrodes to increase. Therefore, the film thickness of the silicon layer is preferably about 0.3 nm to about 1.5 nm. The silicon layer can be formed to have a desired thickness by appropriately changing the pressure in the reaction chamber, formation (processing) time and the flow rate of dichlorosilane.

Then, when tungsten silicide layer 13 is formed by the CVD method, a gas such as chlorine or fluorine stays behind in tungsten silicide layer 13. Heat treatment (rapid thermal annealing (RTA)), as a so-called "degassing process", for removing such residual gas, is carried out at a temperature of about 830° C. in an atmosphere of $N_2$ for about 30 seconds. This heat treatment activates the N-type impurity and the P-type impurity concurrently injected into the N-type silicon layer and the P-type silicon layer, respectively. Further, amorphous silicon layers 9 and 10, at this time, are turned into polysilicon.

Figure 9:
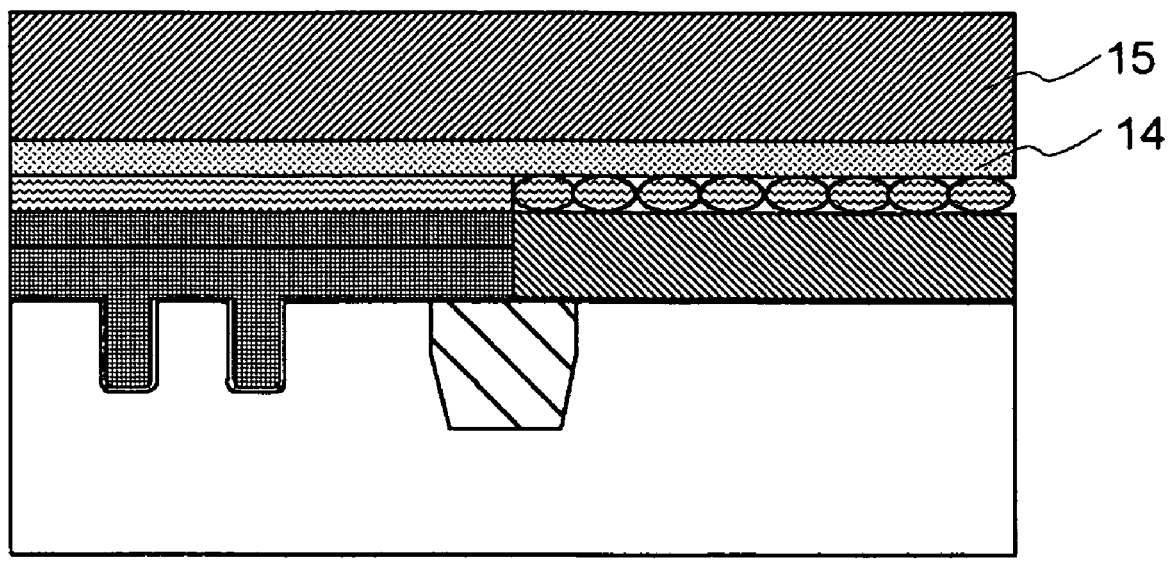

Next, as shown in FIG. 9, tungsten nitride (WN) layer 14 having a thickness of about 10 nm, as a metal nitride layer, is formed by a sputtering method, and subsequently tungsten (W) layer 15 having a thickness of about 60 nm, as a metal layer, is formed on WN layer 14 by the sputtering method.

Figure 10:
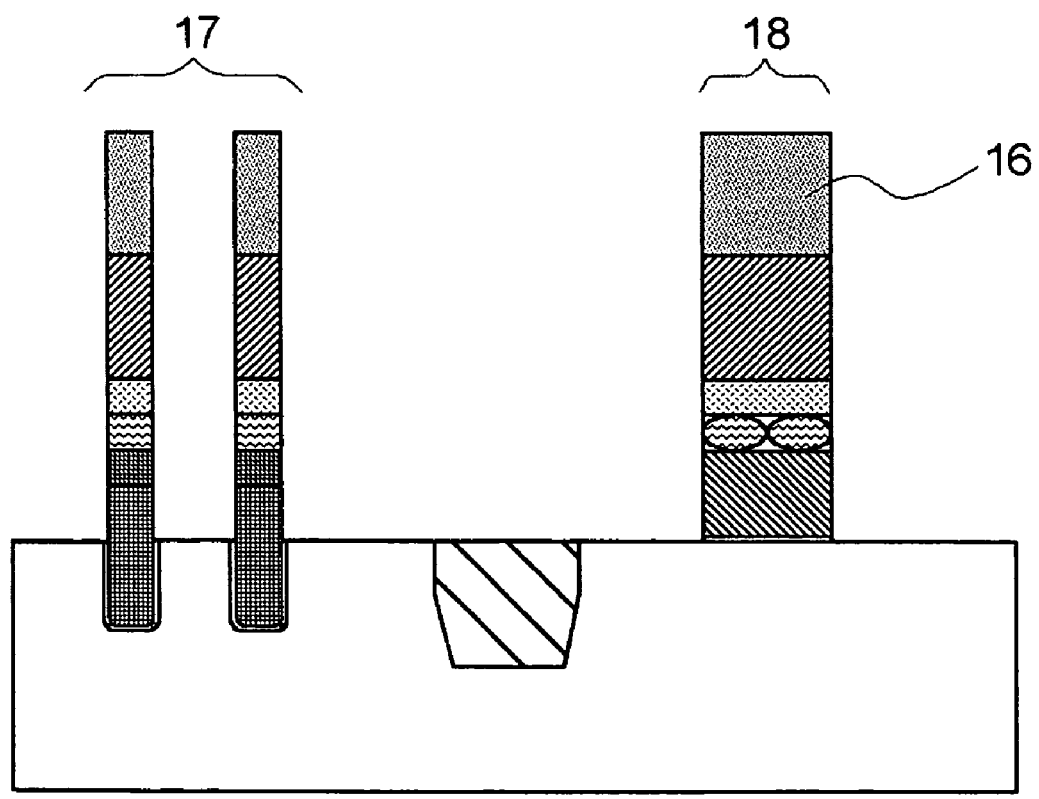

Next, as shown in FIG. 10, silicon nitride film 16 having a thickness of about 200 nm is formed on W layer 15 by the CVD method, and this film is patterned in a gate electrode shape to form an insulating film for an etching mask. A stacked film of W layer 15, WN layer 14, the silicon film, tungsten silicide layer 13 and the polysilicon layer is patterned by dry etching using silicon nitride film 16 as a mask, and so N-type poly-metal gate electrode 17 including the N-type polysilicon layer in Region N, and P-type poly-metal gate electrode 18 including the P-type polysilicon layer in Region P are formed.

Next, because the dry etching for patterning the gate damages an end portion of each gate electrode, heat treatment, to restore the damaged portions, is carried out, and a sidewall oxide film is formed on a sidewall of the polysilicon layer of each gate electrode. In addition, the heat treatment for forming the sidewall oxide film causes the silicon film and the WN layer to react with each other to form a tungsten silicide nitride layer (WSiN layer), but the formed WSiN layer becomes a very thin film, and accordingly electric resistance of the gate electrode is not increased.

Next, Region P is covered with a resist mask (not shown), and an N-type impurity (for example, arsenic (As)) having a high concentration is ion injected into Region N, and thereby an N-type source-drain diffusion layers are formed. Subsequently, after removing the resist mask for covering Region P, a resist mask (not shown) to cover Region N is formed, and a P-type impurity (for example, boron (B)) having a high concentration is ion injected into Region P, and thereby a P-type source-drain diffusion layers are formed.

The processes described above complete the N-channel transistor including the N-type poly-metal grooved gate electrode in Region N and the P-channel transistor including the P-type poly-metal planar gate electrode in Region P.

As described above, in the method for manufacturing the semiconductor device having both of the DRAM having the grooved gate and the DRAM having the planar gate, especially impurity ions fully spread in the polysilicon in the grooved gate electrode, which can prevent the transistor from deteriorating due to depletion. Further, boron diffusion to the tungsten silicide layer can be suppressed, and the mutual diffusion can be also controlled. Further, the resistance in the gate interface also lowers, and there can be provided the method for manufacturing the semiconductor device whose operation can be maintained at a high speed.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

For example, the exemplary embodiment described above has described the example in which, to form the poly-metal gate structure, the tungsten (W) layer as the metal layer, the tungsten nitride (WN) layer as the metal nitride layer and the tungsten silicide ($WSi_2$) layer as the silicide layer are used, but, instead of these, as a matter of course, it is also possible to use a refractory metal such as molybdenum (Mo), cobalt (Co), titanium (Ti), nickel (Ni) or tantalum (Ta), and a nitride layer and a silicide layer of these, as disclosed in JP-A No. 2003-163348 (D1). Moreover, in the exemplary embodiment described above, the first and second refractory metals are same tungsten, but, in the present invention, other same refractory metal or different refractory metals can be used as the first and second refractory metals.

What is claimed is:

1. A method for manufacturing a semiconductor device including both of a grooved gate transistor and a planar gate transistor on a same semiconductor substrate, the method comprises:
   (a) forming a groove in the semiconductor substrate in the forming region of the grooved gate transistor,
   (b) filling the groove provided in the semiconductor substrate in the forming region of the grooved gate transistor to form an amorphous silicon layer on the entire surface,
   (c) ion injecting an impurity of a first conductivity type into the amorphous silicon layer in the forming region of the grooved gate transistor,
   (d) entirely heating the semiconductor substrate to convert the amorphous silicon layer to a polysilicon layer,
   (e) amorphousizing a surface layer of the polysilicon layer, and
   (f) ion injecting an impurity of a second conductivity type into the amorphousized surface layer and the polysilicon layer in the forming region of the planar gate transistor.

2. The method for manufacturing a semiconductor device according to claim 1, wherein, before the step (a), the method further comprises forming an element isolation insulating film for separating the forming region of the grooved gate transistor from the forming region of the planar gate transistor in the semiconductor substrate.

3. The method for manufacturing a semiconductor device according to claim 1, wherein, between the steps (a) and (b), the method further comprises forming a gate insulating film on the entire surface of the semiconductor substrate.

4. The method for manufacturing a semiconductor device according to claim 1, wherein the step (e) amorphousizing a surface layer of the polysilicon layer is carried out by ion injecting an impurity of the first conductivity type into the entire surface of the polysilicon layer.

5. The method for manufacturing a semiconductor device according to claim 1, wherein, after the step (f), the method further comprises:
   (g) stacking a silicide layer of a first refractory metal, a nitride layer of the first refractory metal, and a second refractory metal layer in sequence on the amorphousized surface layer to form stacked layers,
   (h) forming a hard mask made of an insulating film on the stacked layers after the step (g), and
   (i) etching the stacked layers and the polysilicon layer by using the hard mask as a mask; and
   wherein a poly-metal gate electrode including the polysilicon layer having the first conductivity type is formed in the forming region of the grooved gate transistor and a poly-metal gate electrode including the polysilicon layer having the second conductivity type is formed in the forming region of the planar gate transistor.

6. The method for manufacturing a semiconductor device according to claim 5, wherein
   the first conductivity type is N-type, and
   the second conductivity type is P-type.

7. The method for manufacturing a semiconductor device according to claim 6, wherein
   the impurity of the first conductivity type is phosphorous, and
   the impurity of the second conductivity type is boron.

8. The method for manufacturing a semiconductor device according to claim 5, wherein
   the silicide layer of the first refractory metal is a tungsten silicide ($WSi_2$) layer,
   the nitride layer of the first refractory metal is a tungsten nitride (WN) layer, and
   the second refractory metal layer is a tungsten layer.

9. The method for manufacturing a semiconductor device according to claim 8, wherein
   the tungsten silicide layer is formed by a CVD method using dichlorosilane ($SiH_2Cl_2$) and tungsten hexafluoride ($WF_6$) and a material gas.

10. The method for manufacturing a semiconductor device according to claim 9, wherein
    the tungsten silicide layer is formed into a continuous layer in the N-type region and into a discontinuous layer in the P-type region, respectively.

11. The method for manufacturing a semiconductor device according to claim 10, wherein
    the step of forming the tungsten silicide layer further comprises after forming the tungsten silicide layer:
    (j) forming a silicon layer on the tungsten silicide layer, and
    (k) heat treating the semiconductor substrate forming the tungsten silicide layer, and
    wherein due to heat in the step (k), the amorphousized surface layer is turned into a polysilicon layer and simultaneously impurities in the polysilicon layer are activated.

* * * * *